United States Patent
Orla-Jensen et al.

(10) Patent No.: US 11,577,270 B2
(45) Date of Patent: Feb. 14, 2023

(54) SYSTEMS AND METHODS FOR SOLVENT EXTRACTION

(71) Applicant: NORDSON CORPORATION, Westlake, OH (US)

(72) Inventors: Per Orla-Jensen, Vista, CA (US); Stephane Etienne, Bouaye (FR)

(73) Assignee: Nordson Corporation, Westlake, OH (US)

( * ) Notice: Subject to any disclaimer, the term of this patent is extended or adjusted under 35 U.S.C. 154(b) by 0 days.

(21) Appl. No.: 17/031,968

(22) Filed: Sep. 25, 2020

(65) Prior Publication Data

US 2021/0008587 A1  Jan. 14, 2021

Related U.S. Application Data (62) Division of application No. 16/017,386, filed on Jun. 25, 2018, now Pat. No. 10,821,466.
(Continued)

(51) Int. Cl.
*B05C 11/00* (2006.01)
*B05D 3/02* (2006.01)
(Continued)

(52) U.S. Cl.
CPC ............ *B05C 11/00* (2013.01); *B05D 3/0272* (2013.01); *F26B 15/18* (2013.01); *F26B 21/12* (2013.01);
(Continued)

(58) Field of Classification Search
None
See application file for complete search history.

(56) References Cited

U.S. PATENT DOCUMENTS

| 2,203,422 A | 6/1940 | Strobridge |
| 2,470,043 A | 5/1949 | Monsarrat |

(Continued)

FOREIGN PATENT DOCUMENTS

| CN | 1794099 A | 6/2006 |
| CN | 102564949 A | 7/2012 |

(Continued)

OTHER PUBLICATIONS

European search report dated Dec. 3, 2018 for EP Application No. 18182020.
(Continued)

*Primary Examiner* — Jethro M. Pence
(74) *Attorney, Agent, or Firm* — BakerHostetler (57) ABSTRACT

Systems and methods for venting a solvent are disclosed. The system includes a chamber, such as an oven having an interior volume defining a heating zone, where the interior volume receives at least one substrate coated with a coating material comprising a solvent. The system further includes a vent coupled to the oven and defining a passage between the interior volume and the environment external to the oven. The system also includes a solvent sensor measuring an amount of evaporated solvent present in the interior volume, and a fan removing at least a portion of the solvent from the interior volume. The system may also include a coating assembly including an applicator and a flow meter, wherein the applicator applies a portion of the coating material to the substrate, and the flow meter determines the amount of coating material applied to the substrate.

7 Claims, 10 Drawing Sheets

Related U.S. Application Data (60) Provisional application No. 62/529,144, filed on Jul. 6, 2017.

(51) Int. Cl.

| | | |
|---|---|---|
| *F26B 15/18* | (2006.01) | |
| *F26B 21/12* | (2006.01) | |
| *F26B 25/00* | (2006.01) | |
| *H01L 21/67* | (2006.01) | |
| *H01L 21/677* | (2006.01) | |
| *H05K 3/00* | (2006.01) | |
| *H05K 3/22* | (2006.01) | |

(52) U.S. Cl.
CPC ........ *F26B 25/009* (2013.01); *H01L 21/6715* (2013.01); *H01L 21/67034* (2013.01); *H01L 21/6776* (2013.01); *H05K 3/0091* (2013.01); *H05K 3/227* (2013.01); *H05K 2201/09872* (2013.01)

(56) References Cited

U.S. PATENT DOCUMENTS

| | | |
|---|---|---|
| 4,216,592 A | 8/1980 | Koch, II |
| 4,266,504 A | 5/1981 | Roesner |
| 4,872,270 A | 10/1989 | Fronheiser et al. |
| 5,567,237 A | 10/1996 | Kapp-Schwoerer et al. |
| 5,855,077 A | 1/1999 | Nam et al. |
| 5,956,859 A | 9/1999 | Matsumoto et al. |
| 2001/0005525 A1* | 6/2001 | Scheufler ............... F26B 21/003 427/195 |
| 2003/0131885 A1* | 7/2003 | Birtcher ............ C23C 16/45561 137/240 |
| 2006/0137213 A1 | 6/2006 | Asuke |
| 2010/0071348 A1* | 3/2010 | Kobayashi ............. B01D 53/50 423/239.1 |
| 2012/0238075 A1 | 9/2012 | Miyamoto et al. |
| 2016/0137213 A1 | 5/2016 | Kimura et al. |
| 2019/0009298 A1 | 1/2019 | Orla-Jensen et al. |

FOREIGN PATENT DOCUMENTS

| | | |
|---|---|---|
| EP | 3208565 A1 | 8/2017 |
| JP | S59-041772 A | 3/1984 |
| JP | H08-038855 A | 2/1996 |
| JP | 2007-155297 A | 6/2007 |
| TW | 200634438 A | 10/2006 |

OTHER PUBLICATIONS

European Patent Application No. 21157651.7; Extended Search Report; dated Jun. 1, 2021; 8 pages.

* cited by examiner

SYSTEMS AND METHODS FOR SOLVENT EXTRACTION

CROSS REFERENCE TO RELATED APPLICATIONS

This application is a divisional of U.S. patent application Ser. No. 16/017,386, filed Jun. 25, 2018, which claims the benefit of U.S. Provisional Patent App. No. 62/529,144, filed Jul. 6, 2017, the disclosures of which are hereby incorporated by reference herein.

TECHNICAL FIELD

The present disclosure generally relates to dispensing and/or curing liquid coating materials and, more particularly, to systems and methods for monitoring and maintaining an acceptable solvent concentration when applying and/or curing liquid coating material.

BACKGROUND

Many industrial applications require the use of discrete, well-defined and uniform coatings applied to predetermined areas. Conformal coating material is used to protect selected components of a circuit board from moisture, dirt, etc. Such coatings are very useful in varied processes, such as conformal coatings on non-uniform or irregular substrates like electronic circuit boards. It is desirable to obtain broad, uniform coatings using a non-contact applicator with sharp, square, cut-on and cut-off edges.

The conformal coating material typically includes a solvent. During the application and curing of the conformal coating material, the solvent evaporates into the closed environment of the coating system and/or curing oven. Exceedingly high levels of solvent pose an increased fire risk and, as such, the evaporated solvent needs to be removed from the system to allow for uninterrupted operation of the system.

Current systems require continuous extraction levels above a preset threshold to avoid reaching a dangerous solvent concentration. This level is often determined based on worst-case evaporation calculations. However, continuous extraction at the same level is energy inefficient. Therefore, there is a need for improved systems and methods for detecting the level of evaporated solvent in the system and for removing excess evaporated solvent in an efficient manner.

SUMMARY

Systems and methods for venting a solvent are disclosed. In one embodiment, the system includes an oven having an interior volume defining one or more heating zones, where the interior volume receives at least one substrate coated with a coating material comprising a solvent. The system further includes a vent coupled to the oven and defining a passage between the interior volume and the environment external to the oven, one or more solvent sensors measuring an amount of evaporated solvent present in the interior volume, and an optional fan removing at least a portion of the solvent from the interior volume.

In another embodiment, the system includes a coating assembly having one or more applicators and a flow meter. The applicator is configured to apply a portion of a coating material comprising the solvent to a substrate. The flow meter is configured to determine an amount of coating material applied to the substrate. The system may also include an oven having an interior volume defining one or more heating zones. The interior volume receives the substrate coated with the coating material. The system also includes a vent coupled to the oven, where the vent defines a passage between the interior volume and the environment external to the oven. Finally, the system may include a fan in fluid communication with the passage and configured to remove at least a portion of the evaporated solvent from the interior volume.

In yet another embodiment, the system includes a coating assembly defining a chamber, wherein the chamber contains one or more applicators configured to apply a portion of a coating material comprising the solvent to a substrate, and a flow meter configured to determine an amount of coating material applied to the substrate. The system also includes a vent, controller, and fan. The vent is coupled to the coating assembly, and defines a passage between the chamber and the environment external to the coating assembly. The controller is configured to determine an amount of evaporated solvent present in the chamber. Finally, the fan is in fluid communication with the passage and configured to remove at least a portion of the evaporated solvent from the chamber.

In still another embodiment, the system includes a coating assembly including an applicator configured to apply a portion of a coating material comprising the solvent to a substrate. The system also includes an oven, a vent, a fan, and a controller. The oven has an interior volume defining one or more heating zones, where the interior volume receives the substrate coated with the coating material. The vent is coupled to the oven and defines a passage between the interior volume and the environment external to the oven. The fan is in fluid communication with the passage and configured to remove at least a portion of the evaporated solvent from the interior volume. Finally, the controller is configured to determine a concentration of evaporated solvent present in the interior volume and to operate the fan in response to the determined concentration of evaporated solvent present in the interior volume.

In another embodiment, a system for venting a solvent is disclosed. The system includes a chamber having an interior volume including at least one substrate coated with a coating material comprising a solvent. The system also includes a vent coupled to the chamber, where the vent defines a passage between the interior volume and the environment external to the chamber. The system also includes a solvent sensor at least partially located in the interior volume and configured to measure an amount of evaporated solvent present in the interior volume. In addition, the system includes a fan in fluid communication with the passage and configured to remove at least a portion of the evaporated solvent from the interior volume.

In another embodiment, a system for venting a solvent is disclosed. The system includes a coating assembly comprising an applicator and a flow meter. The applicator is configured to apply a coating material having the solvent to a substrate. The flow meter is configured to determine an amount of coating material applied to the substrate. The system also includes a chamber having an interior volume receiving the substrate coated with the coating material and a vent coupled to the chamber. The vent defines a passage between the interior volume and the environment external to the chamber. The system also includes a fan in fluid communication with the passage and configured to remove at least a portion of the evaporated solvent from the interior volume, and a controller configured to determine a concentration of evaporated solvent present in the interior volume based on the amount of coating material applied to the substrate, the evaporation rate of the solvent, the surface area coated on the substrate, the solvent content of the coating material, and the atmospheric volume of the interior volume.

A method of venting a solvent is also disclosed. The method initially introduces a substrate at least partially coated with a coating material comprising a solvent into a heating zone of an oven. The substrate is then heated in the oven to cause the solvent to evaporate. Then, the concentration of the evaporated solvent in the heating zone is calculated.

Another method of venting a solvent is also disclosed. The method initially receives a substrate at least partially coated with a coating material comprising a solvent into a chamber. Nest, the concentration of the evaporated solvent in the chamber is calculated, and, in response to the calculated concentration of the evaporated solvent in the chamber, at least a portion of the evaporated solvent is moved through a vent positioned on the chamber.

BRIEF DESCRIPTION OF THE DRAWINGS

The present application is further understood when read in conjunction with the appended drawings. For the purpose of illustrating the subject matter, there are shown in the drawings exemplary embodiments of the subject matter; however, the presently disclosed subject matter is not limited to the specific methods, devices, and systems disclosed. In the drawings.

Aspects of the disclosure will now be described in detail with reference to the drawings, wherein like reference numbers refer to like elements throughout, unless specified otherwise.

DETAILED DESCRIPTION OF ILLUSTRATIVE EMBODIMENTS

Systems and methods are disclosed for efficiently removing evaporated solvent from a coating system, such as a conformal coating system. The system for applying a conformal coating onto a substrate, such as a printed circuit board, may include an applicator that deposits the conformal coating onto the substrate, and an oven that can heat treat the coated substrate. After the conformal coating is applied to the substrate, the substrate may be moved to the oven for treatment. Alternatively, the applicator and the oven may be housed together. In some embodiments, the coating may contain volatile compounds, such as solvents, that are maintained at a safe concentration within the applicator, oven, or both.

A system 10 for curing a coating material may include an oven 100 and a coating assembly 120. The coating assembly 120 has a coating material source 124 and an applicator 122. Referring to FIGS. 1-5, the oven has an interior volume 110 and one or more heating zones 112. Each heating zone 112 receives the coated substrate 101 and heats the environment within the heating zone 112 to a predetermined temperature. The substrate may be moved on a conveyer belt. In one embodiment, each heating zone 112 may be an enclosure that is separated from the rest of the oven by physical borders or dividers. In another embodiment, with specific reference to the illustrative embodiment in FIG. 1, each heating zone 112 may be a region of the oven 100 that is not physically divided from the rest of the oven. In some embodiments, the heating zone 112 may be defined by the interior volume 110 of the oven, such that the heating zone 112 is in fluid communication with the interior volume 110.

The temperature in each heating zone 112 may be fixed, or it may be adjusted during the heating process. The transition between one heating zone and an adjacent heating zone may be gradual and may include a temperature gradient ranging from the temperature of the first heating zone to the temperature of the second heating zone. In some embodiments, part of the interior volume 110 that defines a first heating zone 112 may also define a second heating zone 112, such that the heating zones 112 overlap.

The system 10 also includes a vent 200. The vent 200 is connected to the oven 100 to allow movement of gases, such as evaporated solvent, inside the oven 100 to an environment external to the oven 100. The vent 200 includes an opening that defines a passage 202 between the interior volume 110 of the oven 100 and the environment external to the oven 100 and, specifically between the heating zone 112 and the environment external to the oven 100. In some embodiments, a single vent may be accessible to the plurality of heating zones 112, such that evaporated solvent in any of the plurality of heating zones 112 may be moved to the environment external to the oven 100. Alternatively, the oven 100 may include a plurality of vents 200, wherein each vent defines a separate passage 202 between the interior volume 110 and the environment external to the oven 100.

In some embodiments, the vent 200 may have a regulator 206 that can be adjusted to vary the rate at which evaporated solvent can flow from the interior volume 110 of the oven 100 to the environment external to the oven 100. The regulator 206 may be positioned adjacent the interior volume 110 of the oven 100, inside the passage 202 defined by the vent 200, or on the vent 200 adjacent the exterior surface of the oven 100. In some embodiments, the vent 200 may include multiple regulators 206 located in the same or in different locations within or adjacent to the vent 200. A regulator 206 may include a baffle, a gate, a valve, or another suitable device that can be adjusted to permit or block the passage of the evaporated solvent.

In some embodiments, the regulator 206 has an open configuration, a partially open configuration, and a closed configuration. In the open and partially open configurations, the passage 202 is substantially unobstructed, and the evaporated solvent can move through the passage in the vent. In the closed configuration, the passage 202 is substantially blocked such that the evaporated solvent is blocked within the interior volume 110 of the oven 100. In the partially open configuration, the passage 202 is obstructed more than in the open configuration but less than in the closed configuration, to allow for intermediate flow of the evaporated solvent.

Figure 3:
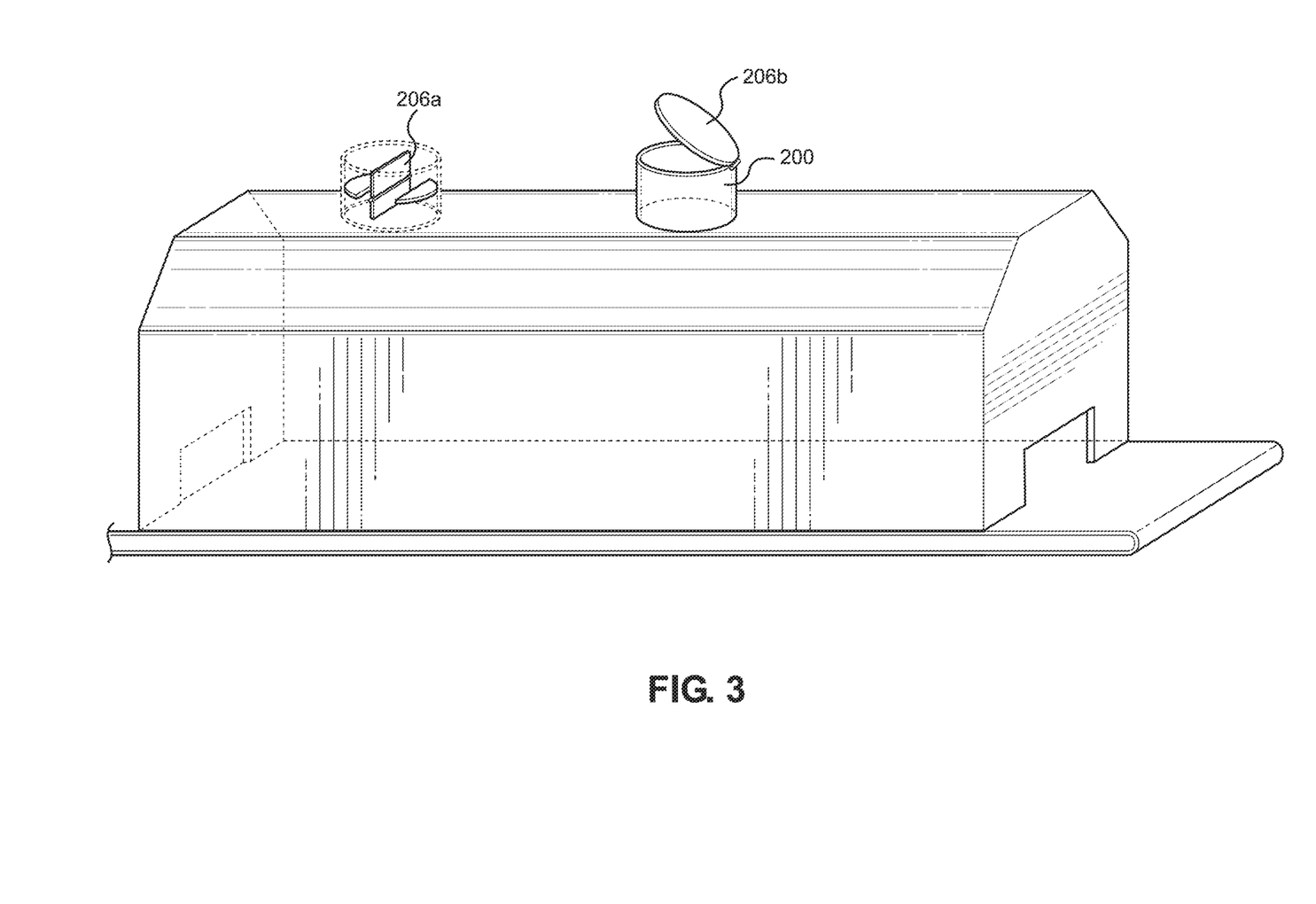
FIG. 3 illustrates a perspective view of an oven in accordance with another embodiment.

Referring to FIG. 3, the regulator 206 may be a vent gate 206a configured to rotate to partially or completely open the regulator 206. The vent gate 206a may have one movable portion or it may have multiple movable portions, as shown in FIG. 3. In another embodiment shown in FIG. 3, the regulator 206 may be a hinged lid 206b positioned on top of the vent 200. The hinged lid 206b swings away from the vent into the open configuration, and returns to cover the vent 200 in the closed configuration. When closed, the hinged lid 206b substantially seals the vent 200 such that the evaporated solvent is blocked within the interior volume 110 of the oven 100.

Figure 1:
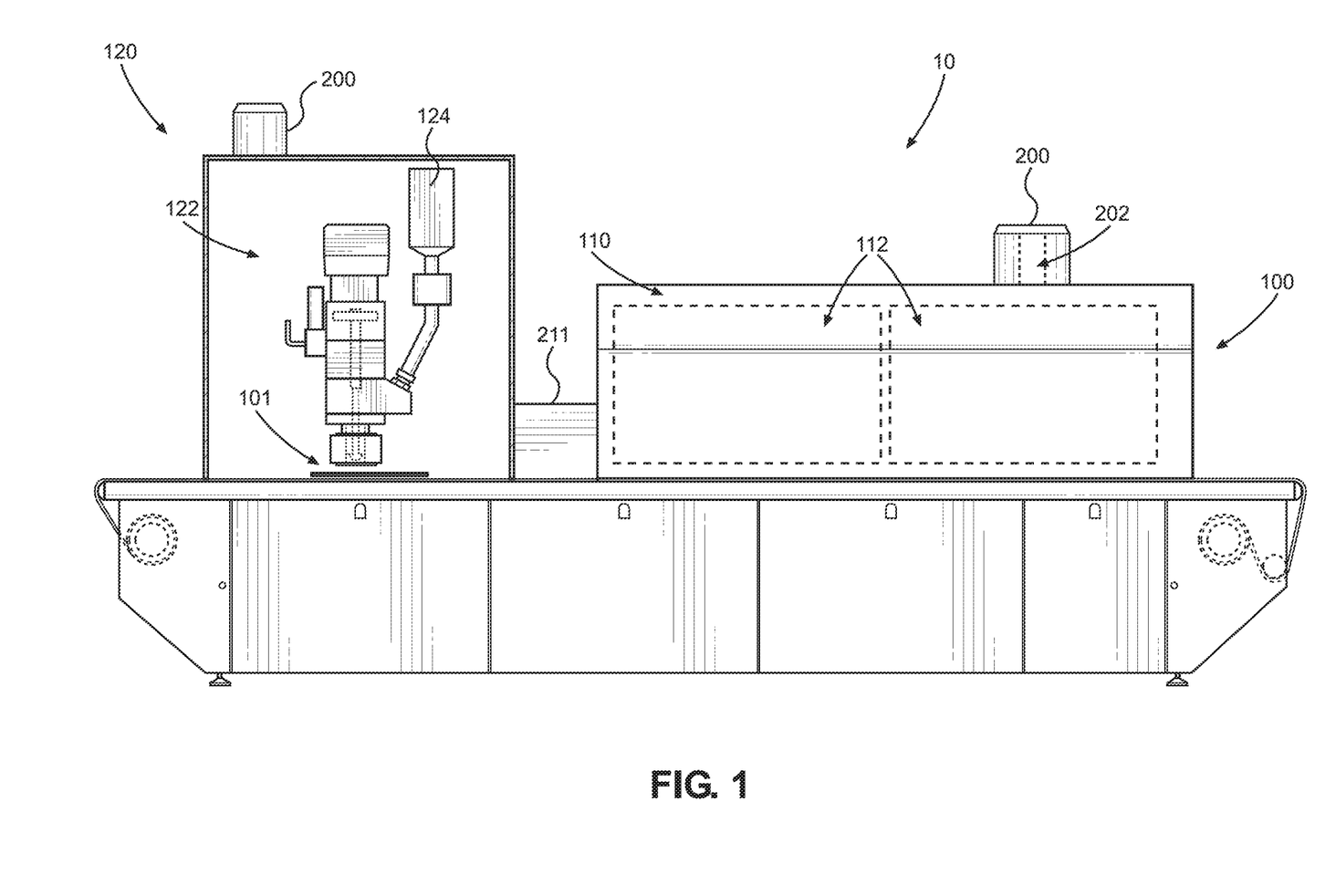
FIG. 1 illustrates a schematic view of a coating system in accordance with an embodiment.
Figure 2:
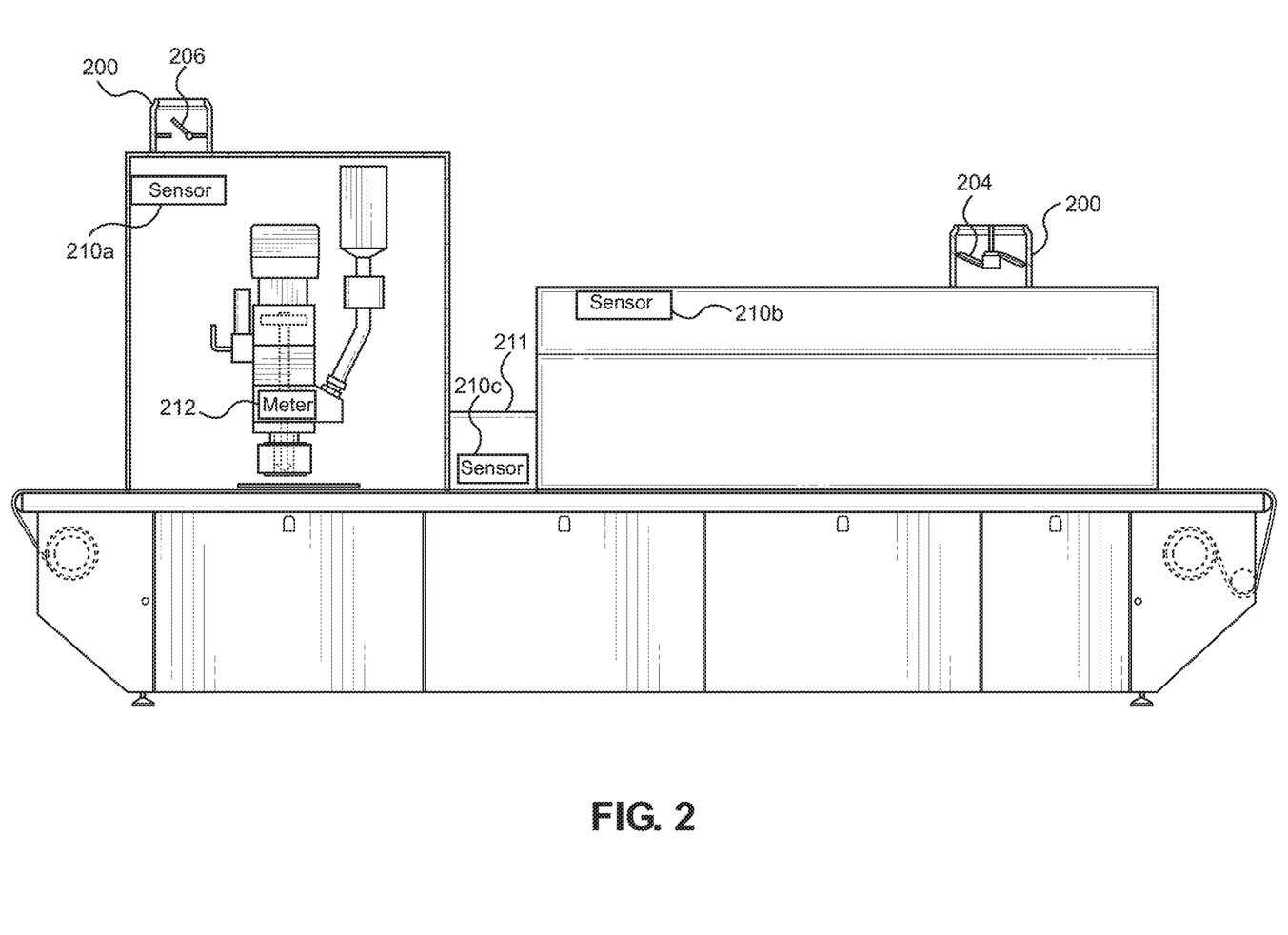
FIG. 2 illustrates a schematic view of a coating system in accordance with another embodiment.
Figure 4:
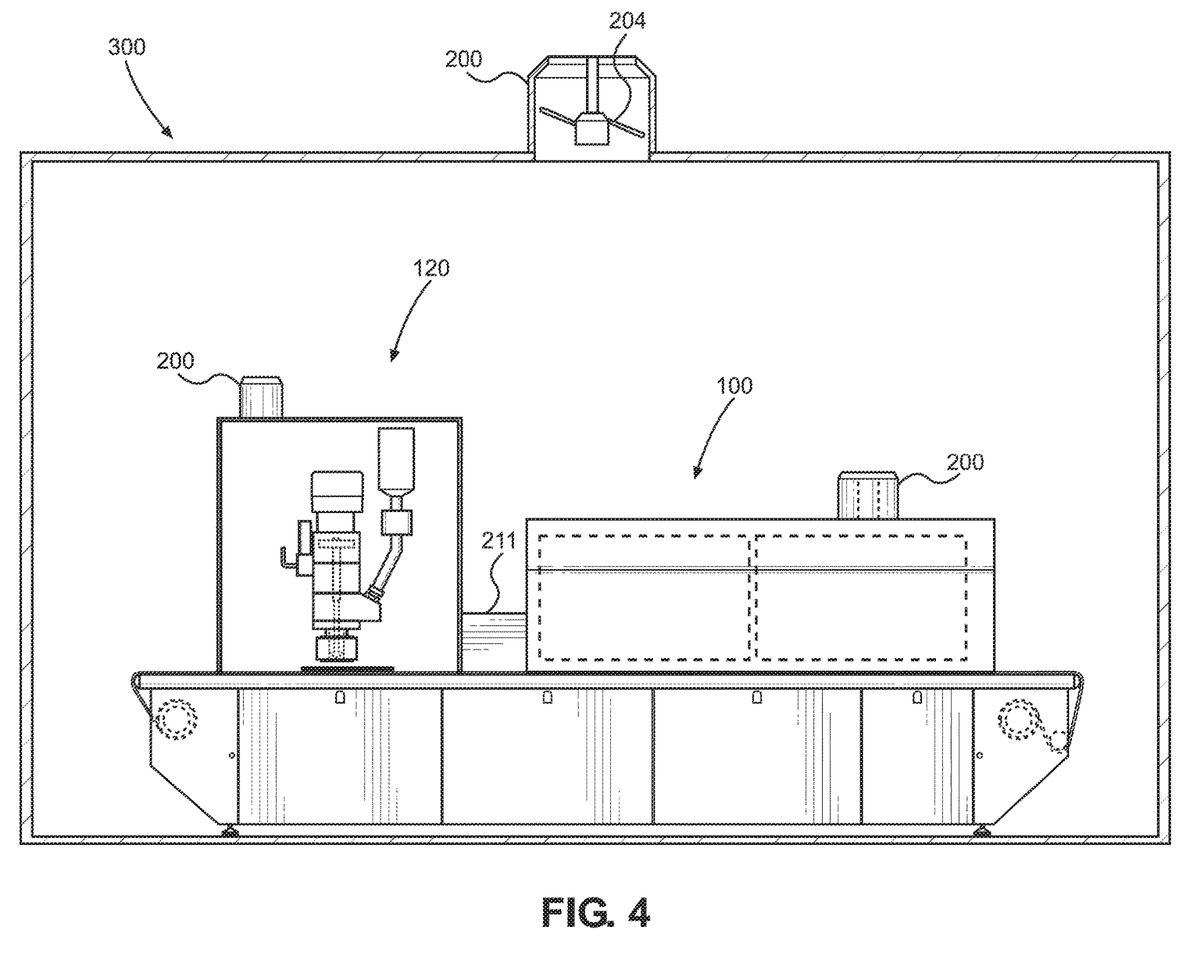
FIG. 4 illustrates a coating system in accordance with another embodiment.

Referring to FIG. 2, for example, the system 10 can include a fan 204 used to create a negative pressure in the interior volume 110 of the oven 100. The fan 204 may be positioned within the interior volume 110 of the oven 100, within the vent 200 as shown in FIG. 2, or external to the oven 100 as shown in FIG. 4. In some embodiments, the system may include multiple fans. In some embodiments, both a fan 204 and a regulator 206 may be included.

In some embodiments, the fan 204 may be disposed within or on a vent 200 extending from the coating assembly 120. In other embodiments, the fan 204 may be disposed in another portion of the system, such as a HVAC unit in fluid communication with the vent 200. For example, the system 10 may be kept inside a closed environment, such as an enclosure 300, and the fan 204 may be disposed on a vent 200 that connects the inside of the closed environment with the outside environment.

The fan 204 and/or regulator 206 may be actuated manually by a user, or they may be configured to automatically actuate in response to a program. For example, the evaporated solvent needs to be removed from the system 10 as the quantity of the evaporated solvent reaches a threshold level. As such, referring to FIG. 2, the system may include a sensor 210 that quantifies how much evaporated solvent is inside a closed volume, such as in the coating assembly 120 (sensor 210a) or in the interior volume 110 of the oven 100 (sensor 210b). The system 10 may have multiple sensors 210 disposed in different volumes of the system.

In some embodiments, the sensor 210 is a solvent sensor that is configured to detect the quantity of the evaporated solvent of a solvent. The sensor 210 can provide real-time levels of evaporated solvent to a controller 180, such as a computer or server, for the generation of alerts or signals to control extraction of the evaporated solvent. The controller 180 may be located on the applicator 122 or may be external to the system 10. The controller 180 may be physically detached from the system 10 while maintaining a functional connection to the sensor 210 (for example, through wireless means). For example, when a predetermined threshold concentration of evaporated solvent is detected, the suction may be increased by adjusting the speed of the fan 204, adjusting the regulator 206 to a partial or completely open position, or by adjusting the HVAC system. Alternatively, if the concentration of evaporated solvent is greater than the predetermined threshold, the system may be shut down.

Figure 5:
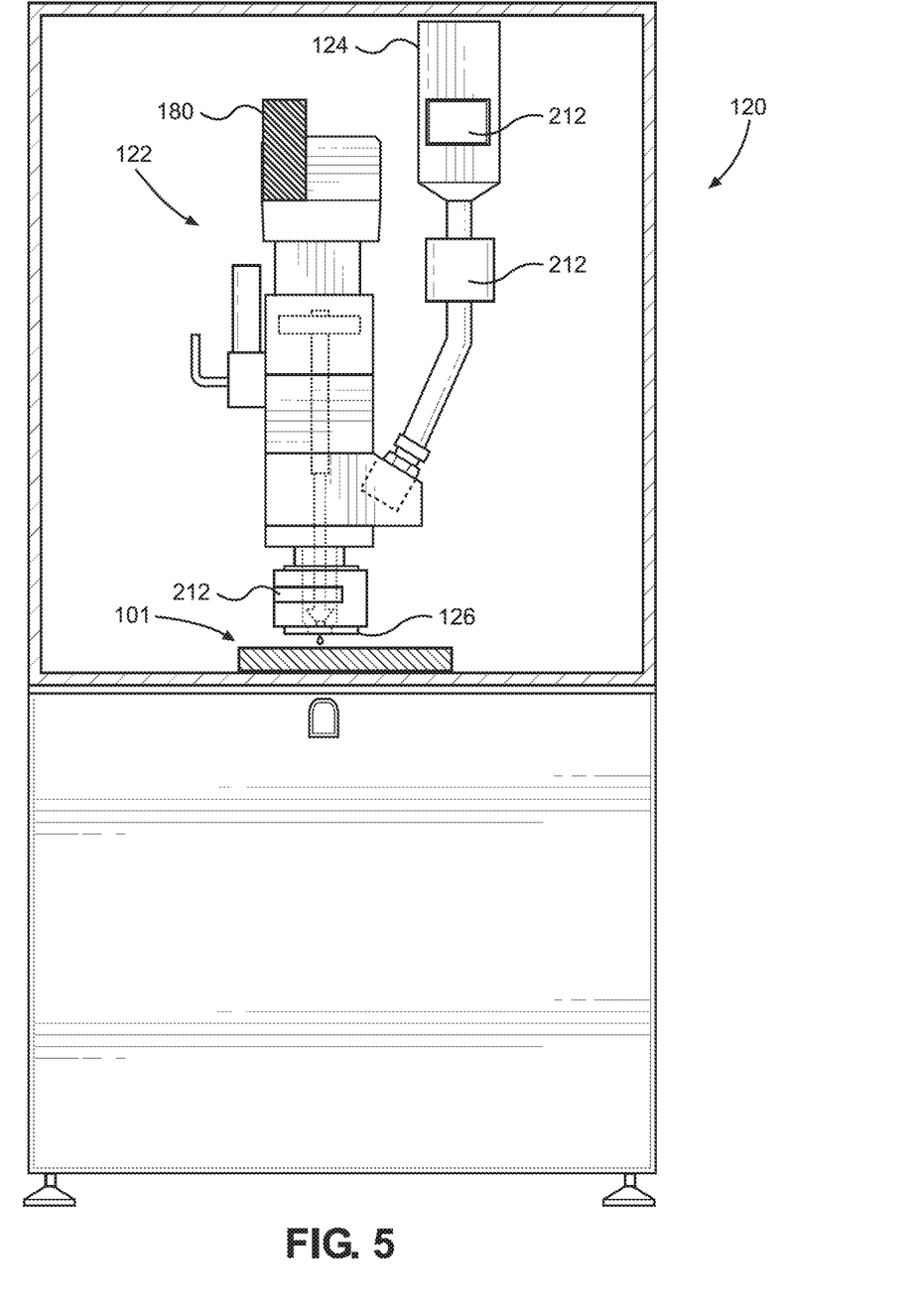
FIG. 5 illustrates a coating assembly in accordance with an embodiment.

In some embodiments, the system 10 may include a flow meter 212 within the coating assembly 120. Referring to FIG. 5, the applicator 122 may be in fluid communication with a coating source 124 and is configured to move coating material (not shown) from the coating source 124 for application onto a substrate 101. The amount of coating material moved through the applicator 122 to the substrate 101 may be quantified with a flow meter 212. In some embodiments, the flow meter 212 may be disposed on the applicator 122, for example on the tip 126 of the applicator 122, such that it can measure how much coating material passes from the applicator to the substrate. In another embodiment, the flow meter 212 may be disposed at the coating material source 124 or between the source and the applicator, such that the flow meter 212 can quantify the amount of coating material that passes from the source to the applicator. In some embodiments, the flow meter 212 may measure the displacement of the coating material within the coating material source 124 or the applicator 122. Some systems may have a plurality of flow meters 212 positioned at multiple locations within the coating assembly 120.

The flow meter 212 can measure one or more parameters of the flow of the coating material. In some embodiments, flow meter 212 may measure the volume, the velocity, or the pressure, and/or the duration of the flow. The flow meter 212 may be connected to a controller 180 configured to receive data from the flow meter 212 and perform analysis on the data. The controller 180 may also be configured to analyze other parameters of the flow, such as the type of coating material, the characteristics of the applicator 122 and/or the oven 100.

In some embodiments, instead of using a solvent sensor, it may be possible to estimate the concentration of evaporated solvent. For example, the controller 180 may receive the quantity of coating material applied to one or more substrates 101 flowing through the system 10 (e.g., from the flow meter 212), the concentration of the solvent material present in the coating material, the evaporation rate of the solvent, the surface area of the one or more substrates 101 that is configured to receive the coating material, and the volume of interest, such as the volume of the interior volume 110 of the oven 100.

The controller 180 uses this information to estimate the concentration of evaporated solvent using the following formula:

$$C_{system} = \frac{M \sim C_{material} \sim R \sim A}{V},$$

wherein $C_{system}$ is the concentration of evaporated solvent in the enclosed volume, M is the quantity of coating material applied to the substrate, $C_{material}$ is the concentration of solvent of the coating material used, R is the evaporation rate of the solvent, A is the surface area of the substrate receiving the coating material, and V is the volume of interest.

The controller 180 then compares the calculated concentration of evaporated solvent to a predetermined threshold to control suction of the evaporated solvent. The controller 180 may also generate an alert to a user if the calculated concentration of evaporated solvent is above the predetermine threshold or is above another alert threshold. In addition, the calculated concentration of evaporated solvent can be displayed to the user in real-time. To control suction of the evaporated solvent, the controller 180 can automatically adjust parameters for application of the coating material or adjust the speed of the fan 204, the regulator 206, or the HVAC system.

For example, if the controller 180 determines that the estimated concentration of evaporated solvent is greater than the predetermined threshold, the controller may decrease the rate of application of the coating material or decrease the rate at which the substrates 101 enter the coating assembly 120. If the controller 180 determines that the estimated concentration of evaporated solvent is lower than the predetermined threshold, the controller 180 may increase the rate of application of the coating material or increase the rate at which the substrates 101 enter the coating assembly 120.

In some embodiments, the system 10 may include an oven 100 or a coating assembly 120 as described herein. It will be understood that a system having an oven may interact with a system having a coating assembly, and this disclosure contemplates systems that have either an oven 100 or a coating assembly 120, as well as systems that have both an oven 100 and a coating assembly 120.

Figure 6:
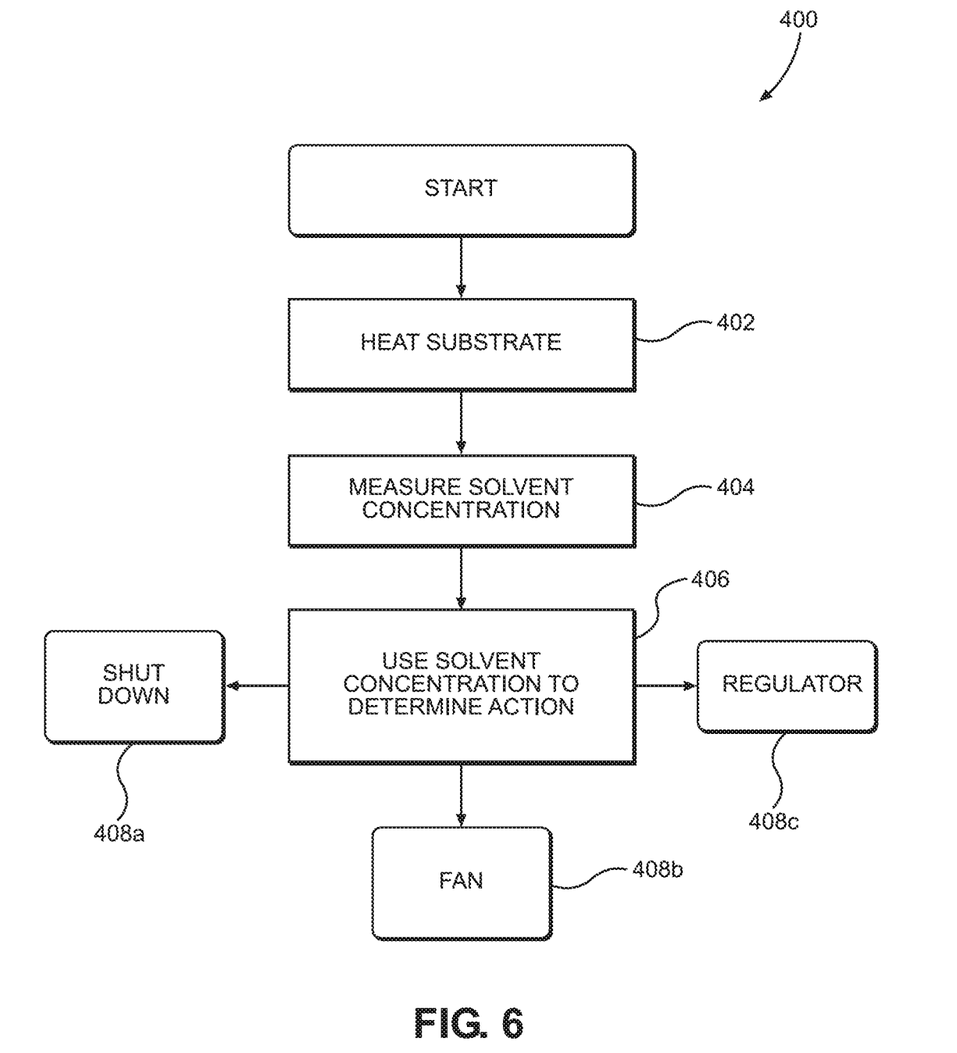
FIG. 6 illustrates a flow diagram of an exemplary method in accordance with an embodiment.

In operation, the system 10 may include a dynamic feedback system. With reference to FIG. 6, a method 400 for curing coating material on a substrate 101 is described according to one embodiment. Initially, in step 402, the substrate 101 coated with a conformal coating is heat cured in the heating zone 112. While the substrate 101 is within the oven 100, the solvent sensor 210 continuously measures the quantity of evaporated solvent inside the oven in step 404. The solvent sensor 210 may measure the solvent at predetermined time increments, once the oven reaches a preset temperature, or according to a program.

In step 406, the controller 180 receives the quantity of evaporated solvent from the solvent sensor 210 to determine the concentration of evaporated solvent based on the known volume of the heating zone 112 and/or interior volume 110. If the concentration of evaporated solvent reaches a predetermined shutdown threshold, the system 10 may be configured to shutdown operation in block 408a. If the concentration of evaporated solvent reaches an action threshold, which is lower than the shutdown threshold, the system 10 may actuate the fan 204 or HVAC system in step 408b or toggle the regulator 206 from the closed configuration to the open configuration or semi-open configuration in step 408c to control suction of the evaporated solvent. If the concentration of evaporated solvent is below the action threshold, the system 10 may maintain operating conditions without change.

In one embodiment, the shutdown threshold may be an evaporated solvent concentration of 25% of a Lower Flammable Limit. The action threshold is preferably below the shutdown threshold and may range, for example, between 5% and 20% of Lower Flammable Limit to enable the system 10 to decrease the evaporated solvent concentration before shutting down. In some embodiments, the method 400 may also include a warning threshold triggering an audible or visual alarm, or an electronic notification to one or more users. The warning threshold may be less than the action threshold, between the action threshold and the shutdown threshold, or above the shutdown threshold.

Figure 7:
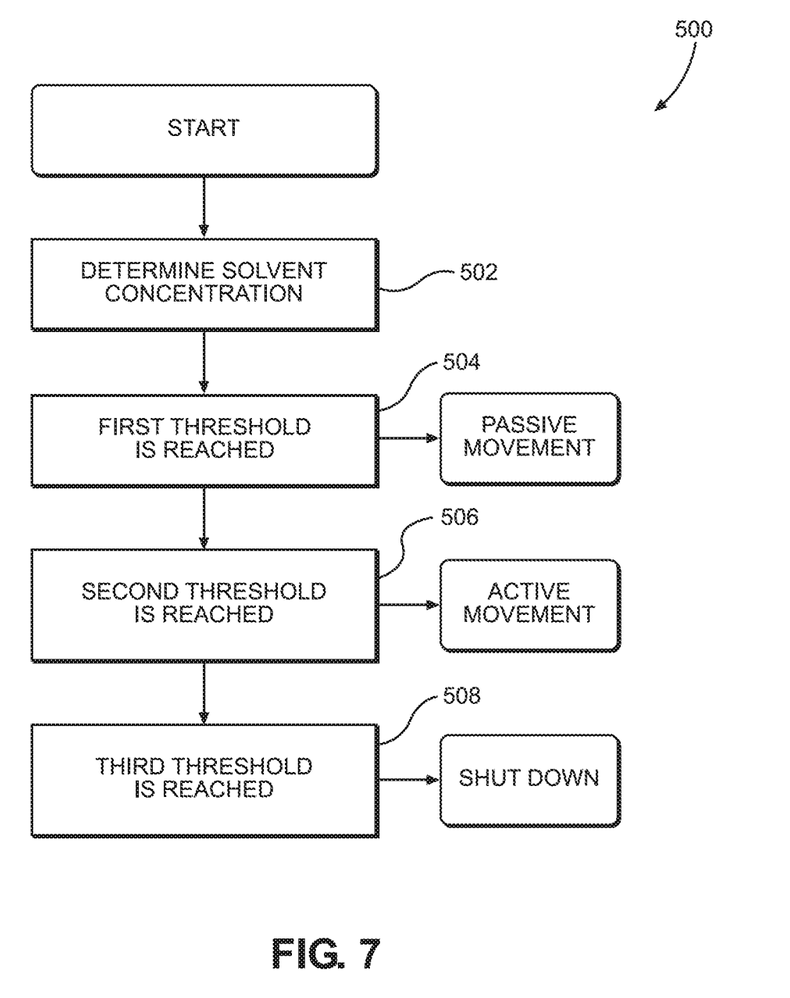
FIG. 7 illustrates a flow diagram with an exemplary method in accordance with another embodiment.

Referring to FIG. 7, a method 500 is described using multiple thresholds to control the evaporated solvent concentration before shutdown. In step 502, the concentration of evaporated solvent is determined as described above. If the solvent concentration equals or exceeds a first threshold in step 504, the system 10 may toggle the regulator 206 from a closed position to a semi-open or to an open position to open the passage 202 of vent 200. The open passage 202 permits the evaporated solvent to passively move out of the system, or allows air from the HVAC system to enter or exit the volume. If the concentration of solvent then reaches a second threshold that is higher than the first threshold in step 506, the system may actuate the fan 204 to actively move the evaporated solvent through the vent 200 by turning on the fan 204 or increasing the speed of the fan 204. If the evaporated solvent concentration continues to a third, shutdown threshold, the system may be configured to shut down.

Figure 8:
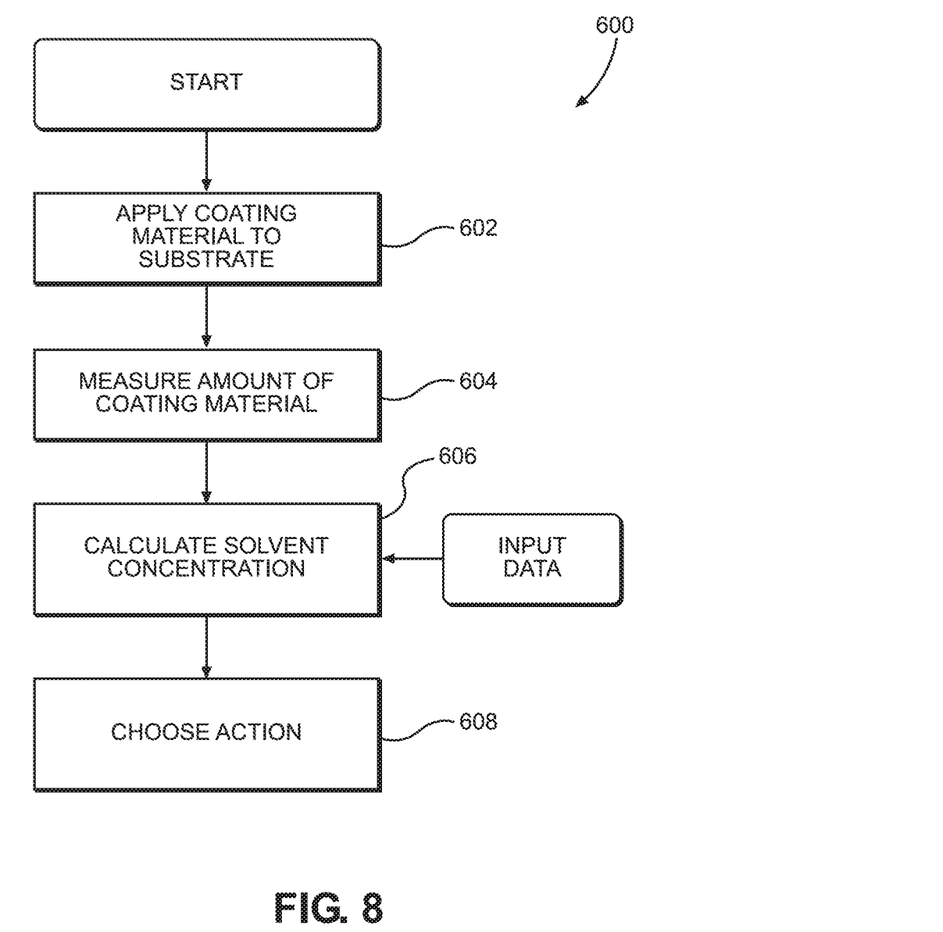
FIG. 8 illustrates a flow diagram with an exemplary method in accordance with yet another embodiment.

The system 10 may utilize a flow meter 212 or a timer that measures the time the coating material is applied to the substrate 101 to estimate the concentration of evaporated solvent. With reference to FIG. 8, a method 600 for estimating the concentration of evaporated solvent using a flow meter or timer is described. In step 602, coating material is applied to the substrate. In step 604, the flow meter 212 measures the quantity of coating material applied to the substrate 101 or a timer measure the amount of time that the applicator tip 126 is applying the coating material. As described above, the flow meter 212 may be disposed at different positions between the coating material source 124 and the substrate 101. Without using the flow meter 212, the flow rate of the coating material may be known and multiplied by the time that the applicator tip 126 is applying the coating material.

The system 10 and/or controller 180 also stores additional parameters to estimate the concentration of evaporated solvent in step 606, as described above. In step 608, the system determines whether the estimated concentration of evaporated solvent is greater than or equal to a predetermined threshold, such as the alert threshold, the action threshold, or the shutdown threshold. If the estimated concentration is higher, the system 10 may decrease the evaporated solvent concentration or shut down in step 608.

Various modifications or additions to the system 10 are contemplated. For example, the system 10 may include a filter and/or a scrubber (not shown) such that the evaporated solvent that passes through the vent 200 is filtered or scrubbed before being released to the environment according local emission regulations. The substrate 101 may alternatively be cured via gas convection or via application of radiation, such as infrared, ultraviolet, or visible radiation.

System 10 may also include a transport element 211 that transfers the substrate from the coating system to the oven. The transport element may include a conveyor, an inverter or flipper, or another suitable structural feature that is configured to move the substrate through the system. The transfer element 211 may be disposed between the coating system and the oven, or it may be disposed within the coating system or the oven. Multiple transfer elements 211 may be present in the system, for example adjacent each of the coating system and the oven, such that the multiple transfer elements 211 may be positioned adjacent one another to move the substrate from the coating system to the oven and/or out of the oven.

In some embodiments, the transport element may include a solvent sensor 210 that can be configured to sense and/or quantify the evaporated solvent and to send a signal to another element of the system. Referring to FIG. 2, the transport system 211 may be disposed between the coating assembly 120 and the oven 100 and may include a solvent sensor 210c.

The embodiments disclosed herein offer a number of advantages. Utilizing a solvent sensor to monitor the evaporated solvent concentration or a flow meter to estimate the evaporated solvent concentration enables for dynamic evaporated solvent removal. Such dynamic evaporated solvent removal decreases the fire and/or explosions risks associated with high levels of evaporated solvent, and minimizes the need for a system shutdown to improve system efficiency. In addition, by only removing evaporated solvent as necessary, energy costs associated removal of the evaporated solvent, including energy costs for cooling air fed into the system 10, are reduced.

While the present disclosure depicts exemplary implementations related to application and curing of conformal coatings, it will be understood that the embodiments disclosed throughout this application may be utilized in a variety of other industrial applications. Similar advantages may be appreciated by incorporating one or more of the above embodiments in liquid painting systems for curing paint coatings or for applying coatings to cans or other containers.

Figure 9:
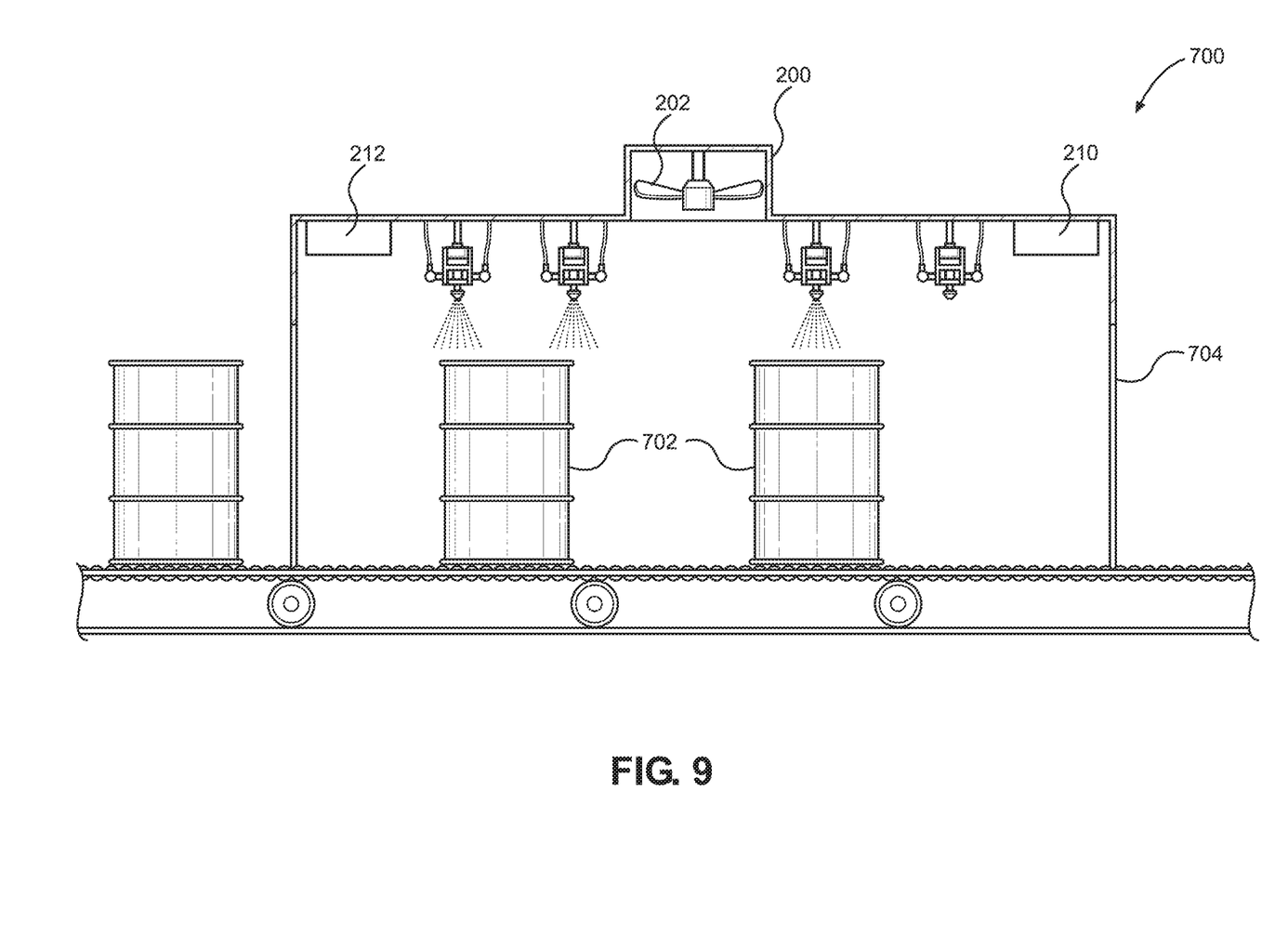
FIG. 9 illustrates a liquid paint application system in accordance with an embodiment.

For example, FIG. 9 shows an illustrative embodiment of a system 700 for applying liquid paint to drums 702. The system 700 has a housing 704, inside which liquid paint is applied to the drums 702. The housing 704 may include a vent 200 defining a passage 202 extending between the interior of the housing 704 and the exterior of the housing 704. The system 700 may further include one or more sensors 210 for quantifying one or more parameters within the system 700. In some embodiments, the system 700 may include a flow meter 212 to quantify the amount of material applied to the drums 702. The operation of the vents 200, the sensors 210, and the flow meters 212 is described throughout this application and may be applied to system 700 as well.

Figure 10:
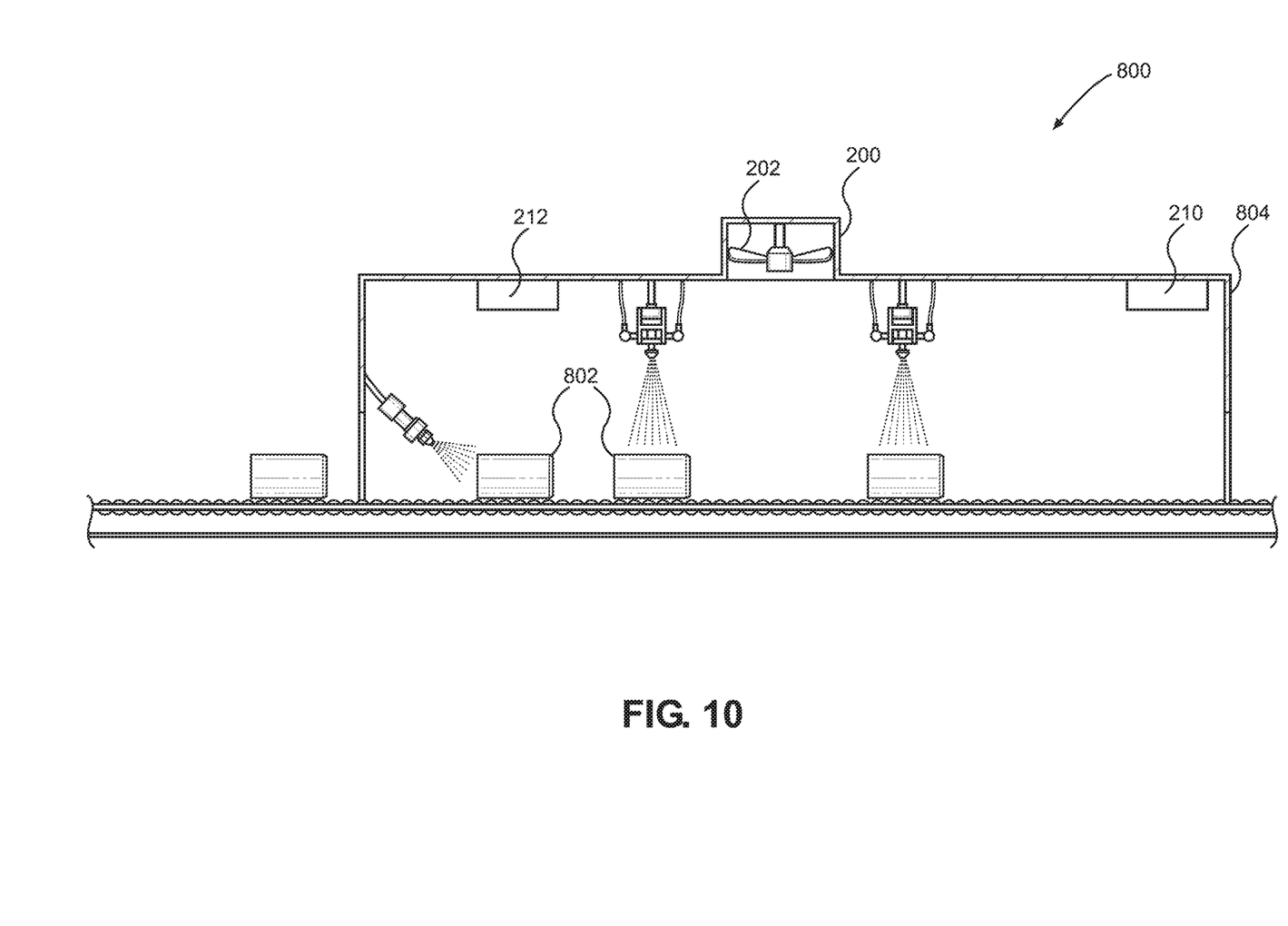
FIG. 10 illustrates a beverage container coating system in accordance with an embodiment.

Referring to FIG. 10, a system 800 is shown for applying a paint or coating to beverage containers (e.g. aluminum cans 802). The system 800 has a housing 804, inside which the coating and/or paint is applied to the cans 802. The housing 804 may include a vent 200 defining a passage 202 extending between the interior of the housing 804 and the exterior of the housing 804. The system 800 may further include one or more sensors 210 for quantifying one or more parameters within the system 800. In some embodiments, the system 800 may include a flow meter 212 to quantify the amount of material applied to the cans 802. The operation of the vents 200, the sensors 210, and the flow meters 212 is described throughout this application and may be applied to system 800 as well.

While systems and methods have been described in connection with the various embodiments of the various figures, it will be appreciated by those skilled in the art that changes could be made to the embodiments without departing from the broad inventive concept thereof. It is understood, therefore, that this disclosure is not limited to the particular embodiments disclosed, and it is intended to cover modifications within the spirit and scope of the present disclosure as defined by the claims.

What is claimed is:

1. A system for venting a solvent, the system comprising:
   a coating assembly defining a chamber, the chamber containing:
      an applicator configured to apply a coating material to a substrate, a portion of the coating material comprising the solvent; and
      a flow meter configured to determine an amount of coating material applied to the substrate;
   a vent coupled to the coating assembly, the vent defining a passage between the chamber and an environment external to the coating assembly;
   a controller configured to determine an amount of evaporated solvent present in the chamber; and
   a fan in fluid communication with the passage and configured to remove at least a portion of the evaporated solvent from the chamber,
   wherein the controller is configured to determine a concentration of evaporated solvent present in the chamber based on the amount of coating material applied to the substrate, an evaporation rate of the solvent, a surface area coated on the substrate, a solvent content of the coating material, and a volume of the chamber.

2. The system of claim 1, wherein the controller is configured to operate the fan in response to the amount of evaporated solvent present in the chamber determined by the controller.

3. The system of claim 1, wherein the fan is disposed within the vent such that when the fan is actuated, and the fan removes at least the portion of the evaporated solvent from an interior volume of the chamber through the passage in the vent to the environment external to the coating assembly.

4. The system of claim 1, wherein the vent further comprises a regulator, the regulator being configured to toggle between an open configuration, a partially open configuration, and a closed configuration,
   wherein in the closed configuration, the regulator blocks movement of the evaporated solvent from an interior volume of the chamber through the passage and to the environment external to the coating assembly, and
   wherein in the open configuration and the partially open configuration, the regulator allows for movement of the evaporated solvent from the interior volume of the chamber through the passage and to the environment external to the coating assembly.

5. The system of claim 4, wherein the fan is disposed in the environment external to the coating assembly and is configured to remove evaporated solvent from the interior volume of the chamber through the regulator when the regulator is in the open configuration or partially open configuration.

6. The system of claim 1, wherein the controller is configured to determine the concentration of evaporated solvent present in the volume of the chamber using the following formula:

$$\frac{\begin{pmatrix} \text{The quantity of} \\ \text{coating material that is} \\ \text{moved to the substrate} \end{pmatrix} + \begin{pmatrix} \text{the solvent} \\ \text{content of the} \\ \text{coating material} \end{pmatrix} + \begin{pmatrix} \text{the evaporation} \\ \text{rate of} \\ \text{the solvent} \end{pmatrix} + \begin{pmatrix} \text{the surface area} \\ \text{of the substrate} \end{pmatrix}}{\text{volume of the chamber}}.$$

7. The system of claim 1, wherein the amount of coating material applied to the substrate is determined based on a time that a valve of the applicator is open to apply the coating material to the substrate and a flow rate of the applicator.

* * * * *